United States Patent
Yamato

(10) Patent No.: US 12,476,635 B2
(45) Date of Patent: Nov. 18, 2025

(54) SEMICONDUCTOR DEVICE, ELECTRONIC APPARATUS AND VEHICLE

(71) Applicant: ROHM CO., LTD., Kyoto (JP)

(72) Inventor: Tetsuo Yamato, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 68 days.

(21) Appl. No.: 18/512,666

(22) Filed: Nov. 17, 2023

(65) Prior Publication Data
US 2024/0178836 A1     May 30, 2024

(30) Foreign Application Priority Data

Nov. 29, 2022   (JP) .................................. 2022-189974

(51) Int. Cl.
*H03K 17/687* (2006.01)
*B60L 50/64* (2019.01)
*H03K 17/0812* (2006.01)

(52) U.S. Cl.
CPC ............ *H03K 17/687* (2013.01); *B60L 50/64* (2019.02); *H03K 17/08122* (2013.01); *H03K 2217/0027* (2013.01)

(58) Field of Classification Search
None
See application file for complete search history.

(56) References Cited

U.S. PATENT DOCUMENTS

| | | | | |
|---|---|---|---|---|
| 5,034,637 A * | 7/1991 | Jungert | ................ | H03K 17/164 327/310 |
| 6,255,874 B1 * | 7/2001 | Shay | ................ | H03K 19/00384 327/170 |
| 8,106,620 B2 * | 1/2012 | Kitanaka | ............... | H02P 29/026 318/807 |
| 8,284,953 B2 * | 10/2012 | Lee | ......................... | H03F 3/217 381/94.8 |
| 8,351,231 B2 * | 1/2013 | Tagome | ................ | H02M 1/088 363/71 |
| 8,963,471 B1 * | 2/2015 | Neumann | ............. | H02P 7/2805 318/400.26 |
| 9,397,657 B1 * | 7/2016 | Zhao | ..................... | H03K 17/127 |
| 9,548,729 B2 * | 1/2017 | Miyamae | ............... | H03K 17/16 |
| 10,153,762 B2 * | 12/2018 | Ladurner | ............. | H03K 17/167 |
| 12,021,516 B2 * | 6/2024 | Okuda | ................. | H10D 62/127 |
| 2012/0280728 A1 * | 11/2012 | Hussein | ............... | H03K 17/127 327/155 |
| 2022/0352145 A1 * | 11/2022 | Takuma | ............... | H03K 17/166 |

FOREIGN PATENT DOCUMENTS

WO     2017/187785     11/2017

* cited by examiner

*Primary Examiner* — Thomas J. Hiltunen
(74) *Attorney, Agent, or Firm* — Fish & Richardson P.C.

(57) ABSTRACT

The present disclosure provides a semiconductor device. The semiconductor device includes: a first terminal; a second terminal; and at least one first switch element and at least one second switch element, configured to be connected between the first terminal and the second terminal; an overcurrent detection circuit, configured to detect an overcurrent flowing through the first terminal; and an off circuit, configured to turn off at least a portion of the at least one second switch element when the semiconductor device is started.

5 Claims, 5 Drawing Sheets

SEMICONDUCTOR DEVICE, ELECTRONIC APPARATUS AND VEHICLE

TECHNICAL FIELD

The disclosure relates to a semiconductor device, an electronic apparatus and a vehicle.

BACKGROUND

So far the applicant has proposed numerous new techniques for semiconductor devices such as in-vehicle intelligent power devices (IPD) (for example, refer to patent publication 1).

PRIOR ART DOCUMENT

Patent Publication

[Patent publication 1] International Publication No. 2017/187785

DETAILED DESCRIPTION OF THE EMBODIMENTS

In the disclosure, a metal oxide semiconductor field effect transistor (MOSFET) refers to a transistor in which a gate structure has at least three layers including "a layer containing a conductor or a semiconductor such as polysilicon with a small resistance value", "an insulating layer", and "a P-type, N-type or intrinsic semiconductor layer". That is to say, the gate structure of the MOSFET not limited to the structure of the three layers including metal, oxide and semiconductor.

<Electronic Apparatus>

Figure 1:
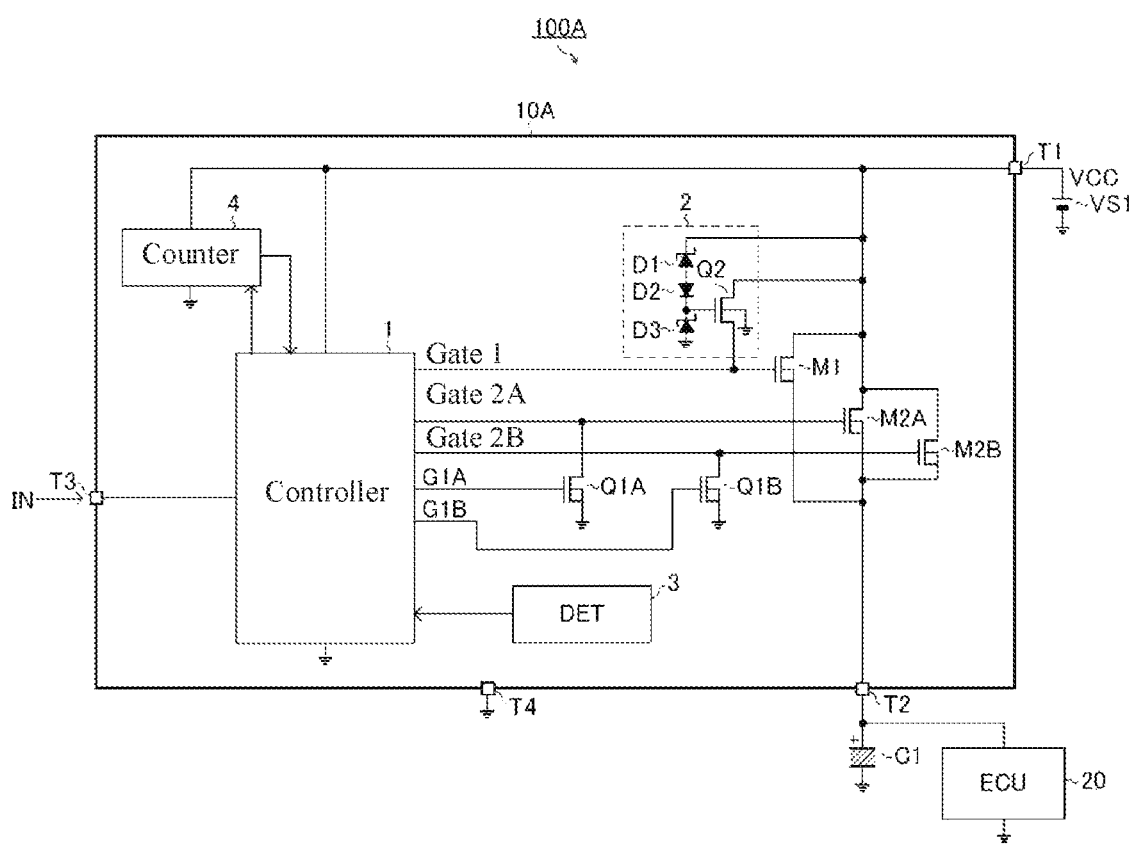
FIG. 1 is a diagram of a configuration example of an electronic apparatus having a semiconductor device.

FIG. 1 shows a diagram of a configuration example of an electronic apparatus having a semiconductor device. An electronic apparatus 100A of this configuration example includes a semiconductor device 10A, a capacitive load which is an electrolytic capacitor C1, an electronic control unit (ECU) 20 and a DC power supply VS1.

The semiconductor device 10A is a high-side switch integrated circuit (IC) (a type of IPD) that turns on/off a connection between a positive electrode of the DC power supply VS1 and the electrolytic capacitor C1.

The semiconductor device 10A includes terminals T1 to T4, which are used as mechanisms for asserting external electrical connections with the device. The terminal T1 is connected to the positive electrode of the DC power supply VS1. A negative electrode of the DC power supply VS1 is connected to a ground potential. The terminal T2 is connected to a first end of the electrolytic capacitor C1 and a power supply terminal of the ECU 20. A second end of the electrolytic capacitor C1 and a ground terminal of the ECU 20 are connected to a ground potential. The terminal T3 receives an input signal IN. The terminal T4 is connected to a ground potential. The DC power supply VS1 outputs a voltage VCC.

The semiconductor device 10A further includes a control circuit 1, an active clamp circuit 2, an overcurrent detection circuit 3, a counter 4, metal oxide semiconductor field effect transistors (MOSFETs) Q1A and Q1B, and output transistors M1, M2A and M2B. Each of the output transistors M1, M2A and M2B is a switch element. More specifically, each of the output transistors M1, M2A and M2B is an N-channel power metal insulator semiconductor field effect transistor (MISFET). A drain of each of the output transistors M1, M2A and M2B is connected to the terminal T1. A source and a back gate of each of the output transistors M1, M2A and M2B are connected to the terminal T2.

The control circuit 1 is connected to the terminal T1. Moreover, the control circuit 1 is further connected to a ground potential. The control circuit 1 is connected to the terminal T3, and performs control operations based on the input signal IN.

The control circuit 1 sets gate signals GATE1, GATE2A and GATE2B respectively supplied to the gates of the output transistors M1, M2A and M2B to high level when the input signal IN is high level. Accordingly, the output transistors M1, M2A and M2B are turned on.

On the other hand, the control circuit 1 sets gate signals GATE1, GATE2A and GATE2B respectively supplied to the gates of the output transistors M1, M2A and M2B to low level when the input signal IN is low level. Accordingly, the output transistors M1, M2A and M2B are turned off.

A drain of the N-channel MOSFET Q1A is connected to the gate of the output transistor M2A. A source and a back gate of the MOSFET Q1A are connected to a ground potential.

A drain of the N-channel MOSFET Q1B is connected to the gate of the output transistor M2B. A source and a back gate of the MOSFET Q1B are connected to a ground potential.

The MOSFET Q1A is an example of an off circuit capable of turning off the output transistor M2A. The MOSFET Q1B is an example of an off circuit capable of turning off the output transistor M2B. The control circuit 1 sets gate signals G1A and G1B respectively supplied to the gates of the MOSFETs Q1A and Q1B to high level during a period that the active clamp circuit 2 is operable. That is to say, the control circuit 1 sets the gate signals G1A and G1B respectively supplied to the gates of the MOSFETs Q1A and Q1B to high level during transition of switching the output transistors M1, M2A and M2B from on to off. Accordingly, the MOSFETs Q1A and Q1B turn off the output transistors M2A and M2B during a period that the active clamp circuit 2 is operable. Thus, since an output transistor that absorbs back electromotive force energy is limited to the output transistor M1, heat concentration in the output transistor during active clamping is alleviated, and active clamping endurance is improved.

When an inductive load is connected to the semiconductor device 10A, the active clamp circuit 2 limits an inter-terminal voltage appearing between the terminal T1 and the terminal T2 to be less than a clamp voltage. The active clamp circuit 2 includes a MOSFET Q2, a Zener diode D1, a diode D2 and a Zener diode D3. The MOSFET Q2 is an N-channel MOSFET.

A cathode of the Zener diode D1 and a drain of the MOSFET Q2 are connected to the terminal T1, and the drain of each of the output transistors M1, M2A and M2B. An anode of the Zener diode D1 is connected to an anode of the diode D2. A cathode of the diode D2 and a cathode of the Zener diode D3 are connected to a gate of the MOSFET Q2. An anode of the Zener diode D3 and a back gate of the MOSFET Q2 are connected to a ground potential. A source of the MOSFET Q2 is connected to the gate of the output transistor M1. Moreover, a series circuit consisting of multiple Zener diodes can also be used in substitution for the Zener diode D1.

The overcurrent detection circuit 3 detects an overcurrent flowing through the terminal T1. An overcurrent detection method of the overcurrent detection circuit 3 is not specifically defined. For example, the overcurrent detection circuit 3 can be configured to include a current sensing transistor that pairs with the output transistor M1 to form a current mirror circuit, a sensing resistor for converting a current flowing through the current sensing transistor to a voltage, and a comparator that compares a potential difference between two ends of the sensing resistor with a reference voltage. When the overcurrent detection circuit 3 detects an overcurrent, for example, the control circuit 1 only has to turn off the output transistors M1, M2A and M2B.

Herein, details when the semiconductor device 10A is started are described. "When the semiconductor device 10A is started" means when the voltage VCC is supplied to the control circuit 1 and the control circuit 1 is in a state capable of performing control operations, and the control circuit 1 switches the output transistor M1 from off to on according to the input signal IN.

Figure 2:
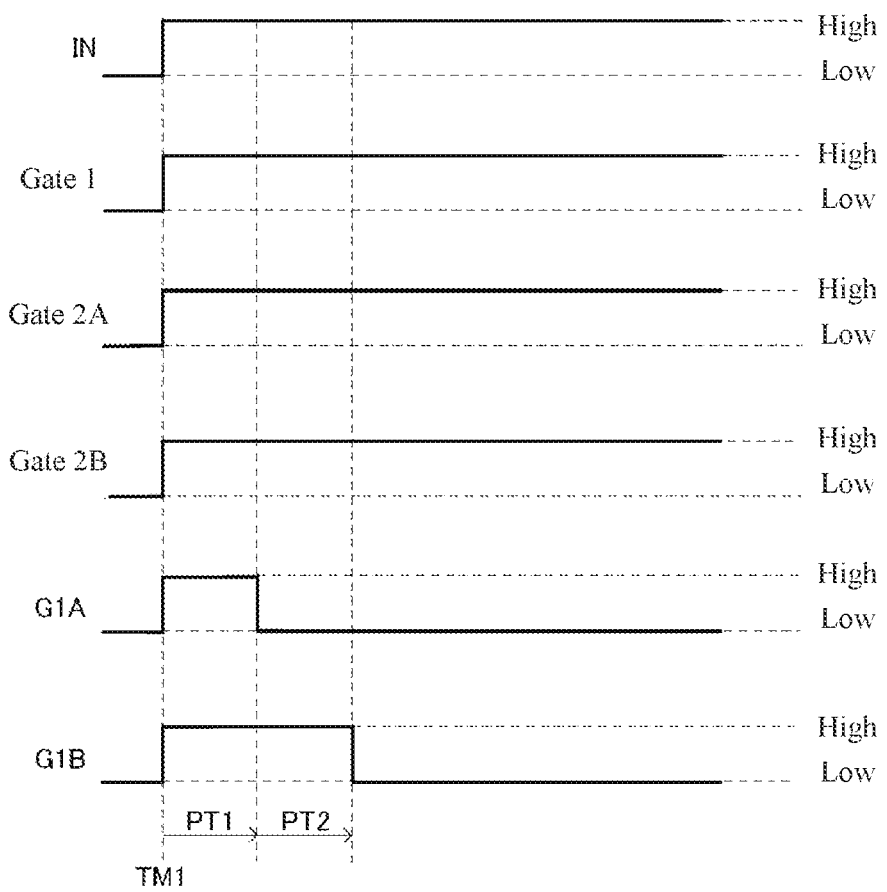
FIG. 2 is a diagram of various signals when the semiconductor device shown in FIG. 1 is started.

FIG. 2 shows a diagram of various signals when the semiconductor device 10A is started. At a startup starting timing TM1 of the semiconductor device 10A, the control circuit 1 switches the gate signals GATE1, GATE2A, GATE2B, G1A and G1B from low level to high level in synchronization with the input signal IN switched from low level to high level.

Thus, at the startup starting timing TM1 of the semiconductor device 10A, the output transistor M1 is turned on, and the output transistors M2A and M2B are turned off via the MOSFETs Q1A and Q1B. Since the output transistors M2A and M2B are turned off and only the output transistor M1 among the output transistors M1, M2A and M2B is turned on, an on resistance of a path connecting the terminal T1 and the terminal T2 is increased. Accordingly, the semiconductor device 10A is capable of inhibiting a surge current during startup of the semiconductor device 10A.

The control circuit 1 starts an operation of the counter 4 at the startup starting timing TM1 of the semiconductor device 10A. Thus, the counter 4 counts time since startup of the semiconductor device 10A.

When a first predetermined period PT1 as counted by the counter 4 has elapsed since the startup starting timing TM1 of the semiconductor device 10A, the control circuit 1 switches the gate signal G1A from high level to low level. Accordingly, the output transistors M1 and M2A are turned on, and the output transistor M2B is turned off via the MOSFET Q1B. Thus, the on resistance of the path connecting the terminal T1 and the terminal T2 is less than that during a period from the startup starting timing TM1 of the semiconductor device 10A to when the first predetermined period PT1 has elapsed.

Moreover, when the first predetermined period PT1 and a second predetermined period PT2 as counted by the counter 4 have elapsed since the startup starting timing TM1 of the semiconductor device 10A, the control circuit 1 switches the gate signal G1B from high level to low level. Accordingly, the output transistors M1, M2A and M2B are turned on.

Thus, the on resistance of the path connecting the terminal T1 and the terminal T2 is less than that during a period from the startup starting timing TM1 of the semiconductor device 10A to when the first predetermined period PT1 and the second predetermined period PT2 have elapsed. Moreover, the first predetermined period PT1 and the second predetermined period PT2 can be of the same length or different lengths from each other. When the first predetermined period PT1 and the second predetermined period PT2 have elapsed from the startup starting timing TM1 of the semiconductor device 10A, startup of the semiconductor device 10A ends, and the semiconductor device 10A transitions to a stable state.

The respective lengths of the first predetermined period PT1 and the second predetermined period PT2 are set as follows: when the first predetermined period PT1 and the second predetermined period PT2 have elapsed from the startup starting timing TM1 of the semiconductor device 10A, charge is accumulated in the electrolytic capacitor C1, and a current flowing through the path connecting the terminal T1 and the terminal T2 is merely a stable current consumed by the ECU 20.

As described above, since the semiconductor device 10A is capable of inhibiting a surge current, unlike means which prevents detection of overcurrent in a surge current, it is not necessary to set an overcurrent detection value to a higher value. Thus, the semiconductor device 10A is capable of detecting any abnormal overcurrent by a stable current in an optimal value, thereby improving safety.

Moreover, during startup of the semiconductor device 10A, between the output transistors M2A an M2B, the number of the output transistor which is turned off over a period of time is reduced. Accordingly, the semiconductor device 10A is capable of reducing the startup time.

Figure 3:
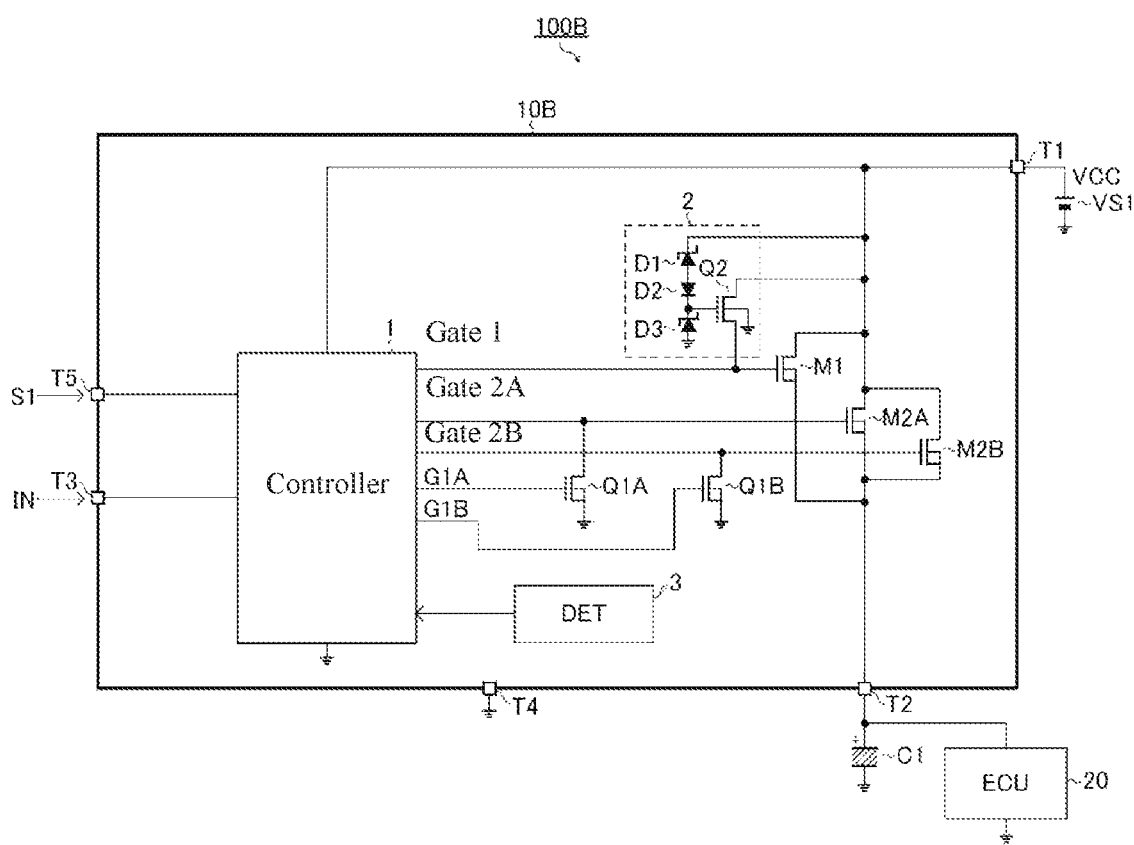
FIG. 3 is a diagram of another configuration example of an electronic apparatus having a semiconductor device.

FIG. 3 shows a diagram of another configuration example of an electronic apparatus having a semiconductor device. An electronic apparatus 100B of this configuration example includes a semiconductor device 10B, a capacitive load which is an electrolytic capacitor C1, an ECU 20 and a DC power supply VS1.

The semiconductor device 10B is in a configuration formed by removing the counter 4 from and adding a terminal T5 to the semiconductor device 10A. Configuration and operation details of the semiconductor device 10B that are the same as the configuration and operation details of the semiconductor device 10A are omitted.

The terminal T5 receives an external signal S1 supplied from outside of the semiconductor device 10B.

Figure 4:
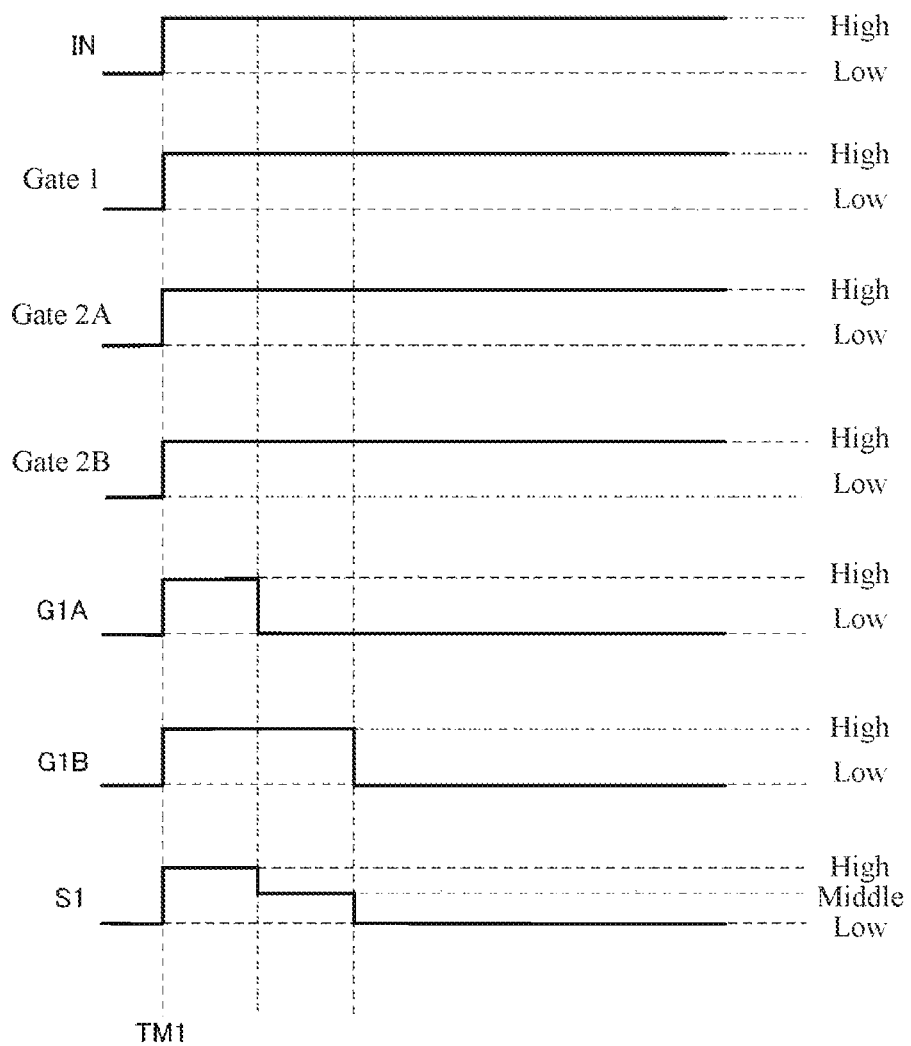
FIG. 4 is a diagram of various signals when the semiconductor device shown in FIG. 3 is started.

FIG. 4 shows a diagram of various signals when the semiconductor device 10B is started. At a startup starting timing TM1 of the semiconductor device 10B, the control circuit 1 switches the gate signals GATE1, GATE2A, GATE2B, G1A and G1B from low level to high level in synchronization with the input signal IN switched from low level to high level.

When the external signal S1 switches from high level to middle level, the control circuit 1 switches the gate signal G1A from high level to low level. Accordingly, the output transistors M1 and M2A are turned on, and the output transistor M2B is turned off via the MOSFET Q1B. Thus, the on resistance of the path connecting the terminal T1 and the terminal T2 is less than that during a period when the external signal S1 is high level.

Then, when the external signal S1 switches from middle level to low level, the control circuit 1 switches the gate signal G1B from high level to low level. Accordingly, the output transistors M1, M2A and M2B are turned on. Thus, the on resistance of the path connecting the terminal T1 and the terminal T2 is less than that during a period when the external signal S1 is middle level. When the external signal S1 becomes low level, startup of the semiconductor device 10B ends, the semiconductor device 10B transitions to a stable state.

The same as the semiconductor device 10A, during startup of the semiconductor device 10B, between the output transistors M2A an M2B, the number of the output transistor which is turned off over a period of time during startup is reduced. However, between the output transistors M2A an M2B, the semiconductor device 10A reduces the number of the output transistor which is turned off over a period of time during startup according to a count number of the counter 4. In comparison, between the output transistors M2A an M2B, the semiconductor device 10A reduces the number of the output transistor which is turned off over a period of time during startup in response to the external signal S1.

The semiconductor device 10B achieves the same effects as the semiconductor device 10A. Since the semiconductor device 10B differs from the semiconductor device 10A in terms of being a configuration without a counter, better miniaturization than the semiconductor device 10A can be achieved.

<Application in Vehicle>

Figure 5:
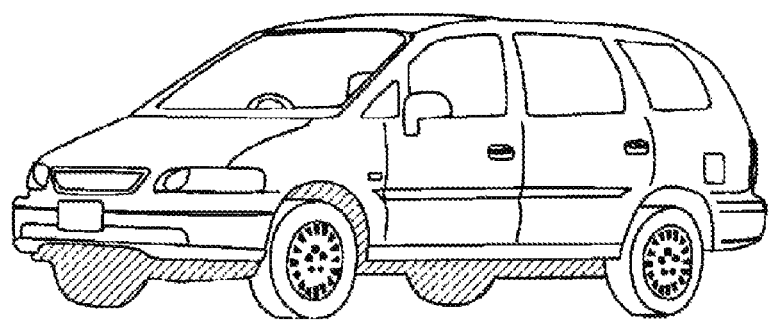
FIG. 5 is an appearance diagram of a configuration example of a vehicle.

FIG. 5 shows an appearance diagram of a configuration example of a vehicle. A vehicle X of this configuration example is mounted with various electronic apparatuses that receive electrical power from a battery to operate accordingly.

In addition to an automobile powered by an engine, the vehicle X further includes an xEV such as a battery electric vehicle (BEV), a hybrid electric vehicle (HEV), a plug-in hybrid electric vehicle/plug-in hybrid vehicle (PHEV/PHV), or a fuel cell electric vehicle/fuel cell vehicle (FCEV/FCV).

The vehicle X can be mounted with the electronic apparatus 100A or 100B above. Moreover, the use of the semiconductor device 10A or 10B in the description above is not limited to being an in-vehicle IPD mounted in a vehicle, and can be, for example, a semiconductor device mounted in an industrial machine or a civilian machine.

Other

Various modifications may be made to the embodiments of the disclosure within the scope of the technical concept of the claims. The various embodiments provided in the description may be appropriately implemented in combination given that no contradiction is incurred. The embodiments above are only examples of possible implementation forms of the present disclosure, and the meanings of the terms of the constituents of the disclosure are not limited to the meanings of the terms specified in the embodiments above.

In the embodiments of the disclosure, the number of the output transistor M1 equivalent to a first switch element is one; however, multiple first switch elements can also be included and be connected in parallel.

In the embodiments of the disclosure, the number of the output transistors M2A and M2B equivalent to second switch elements is two; however, the number of the second switch element can be singular or can be three or more.

In the embodiments of the disclosure, during a period that the active clamp circuit 2 is operable, both of the output transistors M2A and M2B equivalent to second switch elements are turned off; however, it can also be configured that only a portion of the output transistors equivalent to second switch elements is turned off.

For example, in the embodiments, an application example of a high-side switch IC is given; however, the same circuit configuration is also applicable to a low-side switch IC.

Note

A note is attached to the disclosure illustrating specific configuration examples with the embodiments above.

A semiconductor device (10A, 10B) of the disclosure is configured as (a first configuration) comprising:
  a first terminal (T1);
  a second terminal (T2);
  at least one first switch element (M1) and at least one second switch element (M2A, M2B), configured to be connected between the first terminal and the second terminal;
  an overcurrent detection circuit (3), configured to detect an overcurrent flowing through the first terminal; and
  an off circuit (Q1A, Q1B), configured to turn off at least a portion of the at least one second switch element when the semiconductor device is started.

The semiconductor device of the first configuration can also be configured as (a second configuration) further comprising:
  an active clamp circuit (2), configured to be connected to a first control terminal of the first switch element to limit an inter-terminal voltage appearing between the first terminal and the second terminal to be less than a clamp voltage, wherein the off circuit is configured to turn off at least the portion of the at least one second switch element during a period that the active clamp circuit is operable.

The semiconductor device of the first or second configuration can also be configured as (a third configuration), wherein a number of the at least one second switch element is plural, and the off circuit is configured to reduce the number of the at least one second switch element which is turned off over a period of time during startup of the semiconductor device.

The semiconductor device of the third configuration can also be configured as (a fourth configuration) further comprising:
  a counter (4), configured to count time since startup, wherein the off circuit is configured to reduce the number of the at least one second switch element which is turned off according to a count number of the counter during startup of the semiconductor device.

The semiconductor device of the third configuration can also be configured as (a fifth configuration) further comprising:
  a terminal (T5), configured to receive an external signal supplied from outside, wherein the off circuit is configured to reduce the number of the at least one second switch element that is turned off in response to the external signal during startup of the semiconductor device.

An electronic apparatus (100A, 100B) of the disclosure can be configured as (a sixth configuration) comprising:
  the semiconductor device of any one of the first to fifth configurations; and
  a capacitive load (C1), connected to the semiconductor device.

A vehicle (X) of the disclosure is configured as (a seventh configuration) comprising:
the electronic apparatus of the sixth configuration.

The invention claimed is:

1. A semiconductor device, comprising:
a first terminal;
a second terminal;
at least one first switch element and a plurality of second switch elements, configured to be connected between the first terminal and the second terminal;
an overcurrent detection circuit, configured to detect an overcurrent flowing through the first terminal;
an off circuit, configured to turn off at least a portion of the plurality of second switch elements when the semiconductor device is started; and
a counter, configured to count a time since the semiconductor device started, wherein
the off circuit is configured to reduce, during startup of the semiconductor device, a number of second switch elements, of the plurality of second switch elements, which are turned off according to a count number of the counter.

2. The semiconductor device of claim 1, further comprising:
an active clamp circuit, configured to be connected to a first control terminal of the first switch element to limit an inter-terminal voltage appearing between the first terminal and the second terminal to be less than a clamp voltage, wherein
the off circuit is configured to turn off at least the portion of the plurality of second switch elements during a period that the active clamp circuit is operable.

3. The semiconductor device of claim 1, further comprising:
a terminal, configured to receive an external signal supplied from outside, wherein
the off circuit is configured to reduce the number of the plurality of second switch elements that are turned off in response to the external signal during startup of the semiconductor device.

4. An electronic apparatus, comprising:
the semiconductor device of claim 1; and
a capacitive load, connected to the semiconductor device.

5. A vehicle, comprising:
the electronic apparatus of claim 4.

* * * * *